United States Patent
Hashimoto

(10) Patent No.: US 9,337,566 B2
(45) Date of Patent: May 10, 2016

(54) ELECTRICAL CONNECTOR ASSEMBLY AND MOUNTING STRUCTURE THEREOF

(71) Applicant: Tyco Electronics Japan G.K., Kanagawa (JP)

(72) Inventor: Shinichi Hashimoto, Kanagawa (JP)

(73) Assignee: Tyco Electronics Japan G.K., Kanagawa (JP)

( * ) Notice: Subject to any disclaimer, the term of this patent is extended or adjusted under 35 U.S.C. 154(b) by 38 days.

(21) Appl. No.: 14/260,692

(22) Filed: Apr. 24, 2014

(65) Prior Publication Data

US 2014/0322936 A1 Oct. 30, 2014

(30) Foreign Application Priority Data

Apr. 24, 2013 (JP) .................. 2013-091193

(51) Int. Cl.
| | |
|---|---|
| *H01R 4/58* | (2006.01) |
| *H01R 13/52* | (2006.01) |
| *H01R 13/74* | (2006.01) |
| *H05K 1/11* | (2006.01) |
| *H05K 1/02* | (2006.01) |
| *H05K 3/00* | (2006.01) |

(52) U.S. Cl.
CPC .......... *H01R 13/5202* (2013.01); *H01R 13/748* (2013.01); *H05K 1/115* (2013.01); *H05K 1/0298* (2013.01); *H05K 3/0058* (2013.01); *H05K 2203/045* (2013.01)

(58) Field of Classification Search
CPC .. H01R 13/5202; H01R 13/748; H05K 1/115; H05K 1/0298; H05K 3/0058; H05K 5/069

USPC .............. 439/83, 559, 42, 586, 271; 174/151, 174/650, 255, 260, 261, 262, 263, 265, 266
See application file for complete search history.

(56) References Cited

U.S. PATENT DOCUMENTS

| | | | | |
|---|---|---|---|---|
| 2,957,157 | A * | 10/1960 | Carter .................... | H01R 33/02 338/316 |
| 3,688,006 | A * | 8/1972 | Keller .................. | H01B 17/305 174/151 |
| 5,546,280 | A * | 8/1996 | Hasebe .................. | H01C 10/00 361/752 |
| 6,325,644 | B1 * | 12/2001 | Lemke .............. | H01R 43/0249 439/83 |

(Continued)

FOREIGN PATENT DOCUMENTS

| | | |
|---|---|---|
| JP | 200596469 A | 4/2005 |
| JP | 2010135536 A | 6/2010 |

(Continued)

*Primary Examiner* — Abdullah Riyami
*Assistant Examiner* — Nelson R Burgos-Guntin
(74) *Attorney, Agent, or Firm* — Barley Snyder

(57) ABSTRACT

An electrical connector assembly is disclosed having an electrical connector positionable over an opening in a wall to form an airtight seal and an electrical connection between the inside and an outside of the wall. The electrical connector has an insulating board made of insulating material. The insulating board includes a first surface facing the wall, a second surface on the side opposite to the first surface, and a side surface extending from a peripheral edge of the first surface to a peripheral edge of the second surface. An electrical connection portion made of electrically conductive material extends from the first surface through the insulating board to the second surface to electrically connect the first surface to the second surface. A surface roughness region provided at the peripheral edge of the first surface.

16 Claims, 6 Drawing Sheets

(56) References Cited

U.S. PATENT DOCUMENTS

| | | | | |
|---|---|---|---|---|
| 6,358,063 | B1* | 3/2002 | Neidich | H01R 9/096 439/271 |
| 6,844,502 | B2* | 1/2005 | Deng | H01B 17/30 174/151 |
| 7,959,418 | B2* | 6/2011 | Koide | F01C 21/10 277/609 |
| 8,164,006 | B2* | 4/2012 | Kim | H01P 1/2005 174/255 |
| 2002/0070045 | A1* | 6/2002 | Musk | H01L 23/10 174/522 |
| 2007/0201216 | A1* | 8/2007 | Deuringer | H01R 9/091 361/816 |
| 2008/0017415 | A1* | 1/2008 | Suter | G02B 6/4428 174/650 |
| 2008/0139013 | A1* | 6/2008 | Tomura | H05K 1/144 439/65 |
| 2008/0202809 | A1* | 8/2008 | Bader | H01R 13/187 174/650 |
| 2009/0215291 | A1* | 8/2009 | Taguchi | H01R 12/57 439/83 |
| 2009/0309242 | A1* | 12/2009 | Mizuno | B41J 2/14233 257/786 |
| 2011/0080718 | A1* | 4/2011 | Koide | H01L 23/13 361/803 |
| 2011/0095779 | A1* | 4/2011 | Washio | G01R 31/2887 324/756.05 |
| 2011/0207346 | A1* | 8/2011 | Tanaka | H05K 7/1069 439/81 |
| 2011/0214910 | A1* | 9/2011 | Eldridge | H05K 3/4664 174/258 |
| 2012/0244728 | A1* | 9/2012 | Rathburn | H01C 1/14 439/83 |
| 2012/0270423 | A1* | 10/2012 | Iida | H01R 12/79 439/83 |
| 2012/0295454 | A1* | 11/2012 | Jiang | H05K 1/111 439/83 |
| 2013/0330953 | A1* | 12/2013 | Grice | H01L 23/4006 439/277 |
| 2014/0045386 | A1* | 2/2014 | Kimura | H01R 12/523 439/709 |
| 2014/0265809 | A1* | 9/2014 | Hussell | H05K 1/00 313/3 |
| 2014/0305695 | A1* | 10/2014 | Hashimoto | H01R 12/716 174/650 |
| 2014/0322936 | A1* | 10/2014 | Hashimoto | H05K 1/115 439/83 |
| 2014/0347839 | A1* | 11/2014 | Shah | A61B 5/04001 361/784 |
| 2015/0053950 | A1* | 2/2015 | Suematsu | H01B 1/24 257/40 |
| 2015/0130548 | A1* | 5/2015 | Matsuzawa | H03H 9/15 331/154 |
| 2015/0191012 | A1* | 7/2015 | Yoshiike | B41J 2/14 347/54 |
| 2015/0216038 | A1* | 7/2015 | Wang | H05K 1/0271 361/709 |

FOREIGN PATENT DOCUMENTS

| | | |
|---|---|---|
| JP | 20129659 A | 1/2012 |
| JP | 201337890 A | 2/2013 |

* cited by examiner (A)

(B)

(A)

(B)

(A)

(B)

ELECTRICAL CONNECTOR ASSEMBLY AND MOUNTING STRUCTURE THEREOF

CROSS-REFERENCE TO RELATED APPLICATIONS

This application claims the benefit of the filing date under 35 U.S.C. §119(a)-(d) of Japanese Patent Application No. 2013-091193, filed Apr. 24, 2013.

FIELD OF THE INVENTION

The invention is generally related to an electrical connector assembly, and more specifically to an electrical connector assembly suitable for use in a sealed apparatus.

BACKGROUND

A conventional electrical connector for connecting an inner surface of a wall of a sealed chamber with an outside surface of the wall is disclosed in Japanese Patent Application No. 2013-37890. A base member of epoxy resin containing glass is disclosed for closing an opening in the chamber wall of the sealed chamber. A metal plate is positioned on a side of the electrical connector, and the entire circumferential edge of the metal plate is soldered to the chamber wall upon mounting the electrical connector.

However, since the entire circumference has been soldered to the wall, when a failure occurs in the electrical connector or the soldered portion, replacement of the electrical connector is difficult, often requiring the whole chamber having the wall to be discarded.

Japanese Patent Application No. 2010-135536 discloses a load lock apparatus having an elastic plate and an O-ring used to seal openings in walls. The elastic plate can be easily removed by detaching a clamp member and a screw for fixing the elastic plate to the chamber wall, allowing the electrical connector to be easily replaced.

Combining the O-ring approach used in JP 2010-135536 with the conventional electrical connector described in JP 2013-37890 is highly desirable, because the conventional electrical connector could easily be removable without having to discard the whole chamber having the wall when the connector fails.

However, when sealing is performed using the O-ring, industrial standards such as JIS Standards require a member making contact with the O-ring to have a predetermined surface roughness of at least Ra 3.2 µm or less. Since the electrical connector described in JP 2013-37890 A is made of epoxy resin containing glass, it is extremely difficult to form a surface of the electrical connector such that the surface has the predetermined surface roughness required by the industrial standards.

Therefore, there is a need for a flat electrical connector assembly which is easily replaceable, where a predetermined surface roughness can be obtained, and a mounting structure thereof.

SUMMARY

It is therefore an object of the invention to disclose an electrical connector assembly having an electrical connector positionable over an opening in a wall to form an airtight seal and an electrical connection between the inside and an outside of the wall. The electrical connector has an insulating board made of insulating material. The insulating board includes a first surface facing the wall, a second surface on the side opposite to the first surface, and a side surface extending from a peripheral edge of the first surface to a peripheral edge of the second surface. An electrical connection portion made of electrically conductive material extends from the first surface through the insulating board to the second surface to electrically connect the first surface to the second surface. A surface roughness region provided at the peripheral edge of the first surface.

BRIEF DESCRIPTION OF THE DRAWINGS

The invention will now be described by way of example with reference to the accompanying figures, of which.

DETAILED DESCRIPTION OF THE EMBODIMENT(S)

Figure 1:
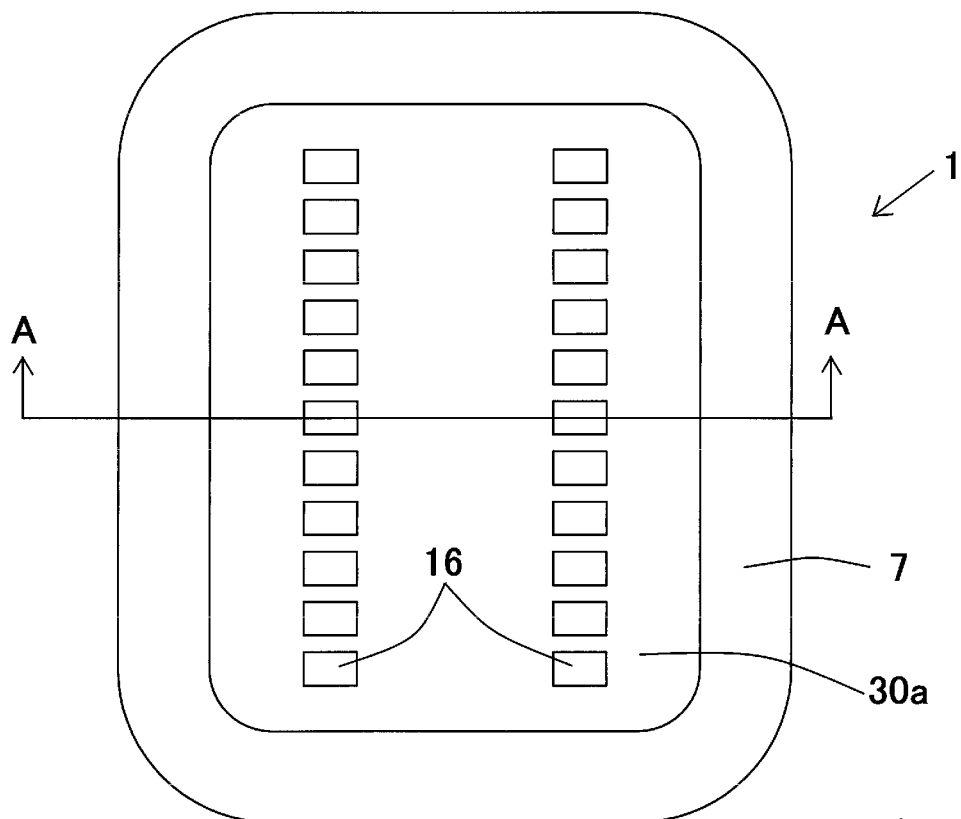
FIGS. 1A and 1B show an electrical connector assembly, FIG. 1A being a plan view thereof and FIG. 1B being a sectional view thereof taken along line A-A in FIG. 1A.
Figure 1:
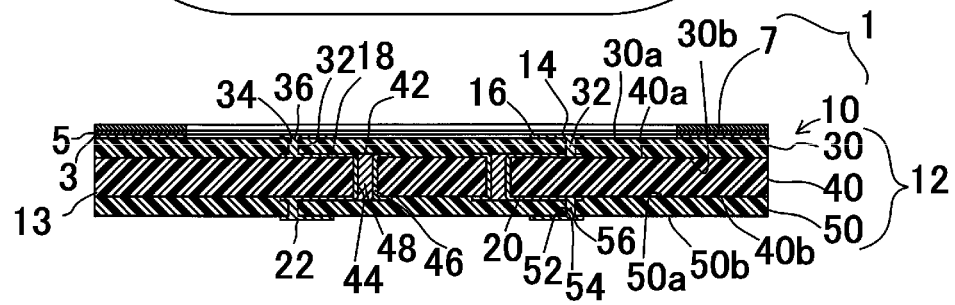

The invention will be described below by way of examples with reference to the accompanying drawings.

The electrical connector assembly 1 shown in FIGS. 1A and 1B comprises a flat electrical connector 10 and a metal plate 7 positioned on a first surface of the electrical connector 10. The electrical connector 10 includes an insulating board 12 and an electrical connection portion 14. The insulating board 12 has three rectangular base members, a first base member 30, a second base member 40 and a third base member 50, stacked in the order from an inside (the side facing the top of the page in FIG. 1B) to an outside (the side facing the bottom of the page in FIG. 1B). Each base member 30, 40, 50 is made of epoxy resin containing glass.

FIG. 1B shows and exemplary electrical connector 10 having a four-layer board with a first electrically-conductive layer 16 on an inner surface 30a of the first base member 30 positioned at an innermost side, a second electrically-conductive layer 18 between the first base member 30 and the second base member 40, a third electrically-conductive layer 20 between the second base member 40 and the third base member 50, and a fourth electrically-conductive layer 22 on an outer surface 50b of the third base member 50 positioned at an outermost side, respectively. The electrical connector 10 has a top surface (the inner surface 30a of the first base member 30), a bottom surface (the outer surface 50b of the third base member 50), and a side surface 13 extending from a peripheral edge of the top surface to a peripheral edge of the bottom surface.

The first base member 30 is formed with a plurality of first electrically-conductive portions 32 electrically interconnecting the first electrically-conductive layer 16 on the inner surface 30a to the second electrically-conductive layer 18 on an outer surface 30b, which is positioned between the first base member 30 and the second base member 40. Each first electrically-conductive portion 32 is formed by filling a first through-hole 34 in the first base member 30 with electrically-conductive plating 36. The plurality of first electrically-conductive portions 32 are positioned in two lines in a width direction of the first base member 30. Although not illustrated, the first electrically-conductive portions 32 in each line are arranged at a predetermined pitch along a longitudinal direction of the line (a vertical direction in FIG. 1A extending from the top of the page to the bottom).

The second base member 40 is formed with a plurality of second electrically conductive portions 42 electrically interconnecting the second electrically-conductive layer 18 on an inner surface 40a thereof, which is positioned between the first base member 30 and the second base member 40, and the third electrically-conductive layer 20 on an outer surface 40b, between the second base member 40 and the third base member 50. Each second electrically conductive portion 42 has an electrically-conductive plating portion 46 made of tin plating or gold plating applied to an inner periphery of a second through-hole 44 of the second base member 40. An internal space of each second electrically conductive portion 42 is filled with an electrically-conductive filler 48 such as solder). The plurality of second electrically conductive portions 42 are positioned in two lines in a width direction of the second base member 40. Although not illustrated, the second electrically conductive portions 42 in each line are arranged at a predetermined pitch along a longitudinal direction of the line (the vertical direction in FIG. 1A extending from the top of the page to the bottom).

The third base member 50 is formed with a plurality of third electrically-conductive portions 52 electrically interconnecting the third electrically-conductive layer 20 on an inner surface 50a thereof, which is positioned between the second base member 40 and the third base member 50, and the fourth electrically-conductive layer 22 on an outer surface 50b thereof. Each third electrically-conductive portion 52 is formed by filling a third through hole 54 of the third base member 50 with electrically-conductive plating 56. The plurality of third conductive portions 52 are positioned in two lines in a width direction of the third base member 50. Although not illustrated, the third electrically-conductive portions 52 in each line are arranged at predetermined pitches in a longitudinal direction of the line (the vertical direction in FIG. 1A extending from the top of the page to the bottom).

The electrical connection portion 14 electrically connects the top surface 30a and the bottom surface 50b of the insulating board 12 by connection of the first electrically-conductive layer 16, the first electrically-conductive portion 32, the second electrically-conductive layer 18, the second electrically conductive portions 42, the third electrically-conductive layer 20, the third electrically-conductive portion 52 and the fourth electrically-conductive layer 22 in this order.

A peripheral layer 3 on which plating can be performed is formed on a peripheral edge of the surface 30a of the insulating base member 12 which is also an inner surface of the first base member 30. A layer of solder 5 is formed on the peripheral layer 3 on which plating can be performed.

Figure 2:
FIG. 2 is a side sectional view showing a metal plate in the electrical connector assembly shown in FIGS. 1A and 1B.

In FIG. 2, the metal plate 7 is a thin metal plate having a large opening 8 in the center, and having an approximate same shape as the peripheral layer 3 on which plating can be performed of the electrical connector 10. In one exemplary embodiment, an upper face 7a of the metal plate 7 has surface roughness of at least Ra3.2 µm or less. In another exemplary embodiment, the upper face 7a has a surface roughness of at least Ra1.6 µm or less. In another embodiment, the upper face 7a has a surface roughness of Ra0.8 µm or less. The term "surface roughness region" means an upper face 7a having a surface roughness of any one of these Ra. Reference made herein to good surface roughness refers to a surface roughness of any one of these Ra.

Figure 3:
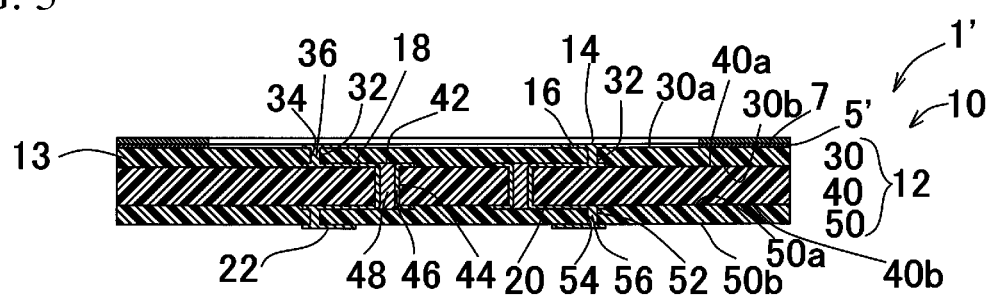
FIG. 3 is a side sectional view showing the electrical connector assembly shown in FIGS. 1A and 1B.

FIG. 1 further shows the electrical connector assembly 1 formed by positioning the electrical connector 10 on the metal plate 7. In an embodiment, the electrical connector assembly 1 is formed by soldering the metal plate 7 to the electrical connector 10. In another embodiment shown in FIG. 3, instead of the solder 5, an adhesive 5' is used to attach the electrical connector 10 to the metal plate 7. When the adhesive agent 5' is used, it is unnecessary to provide the peripheral layer 3 on which plating can be performed. When an electrically-conductive adhesive agent is used as the adhesive agent, an electrical path can be formed between the connector assembly 1 and a wall 60 (see FIG. 4) like the case of using the solder 5. In another embodiment, instead of the metal plate 7, a flat resin member having a surface roughness region on an upper face is be used.

Figure 4:
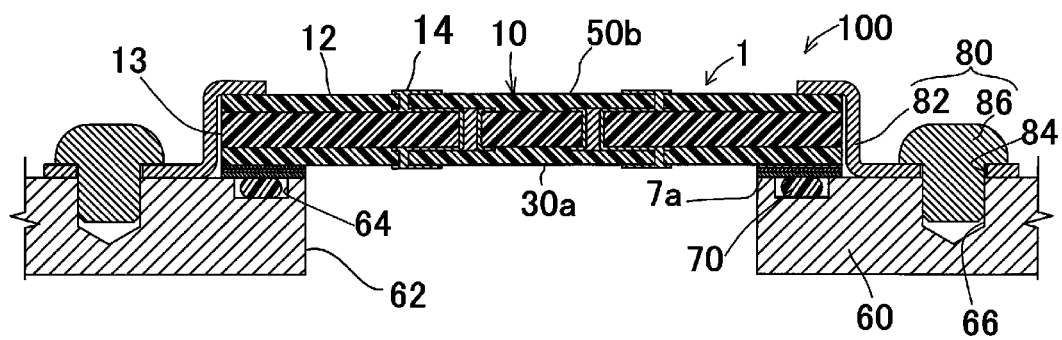
FIG. 4 is a sectional view of a mounting structure using the electrical connector assembly shown in FIGS. 1A and 1B.

In FIG. 4, the mounting structure 100 includes the electrical connector assembly 1, the wall 60 onto which the electrical connector assembly 1 is mounted, an O-ring 70 disposed between the electrical connector assembly 1 and the wall 60, and a fastener 80 for attaching the electrical connector assembly 1 to the wall 60. The wall 60 is a portion of a chamber (not shown) having air tightness, and has an opening 62. A circumferential groove 64, into which the O-ring 70 is disposed, is formed around the opening 62 of the wall 60. An inner surface of the circumferential groove 64 has good surface roughness.

Next, a mounting procedure of the electrical connector assembly 1 to the wall 60 will be described. In FIG. 4, the electrical connector assembly 1 is positioned to cover the opening 62 of the wall 60, such that the O-ring 70 disposed in the circumferential groove 64 contacts the upper face 7a of the metal plate 7. Next, a clamp member 82, having a screw hole 84 is attached to the electrical connector assembly 1. The clamp member 82 is one example of the fastener 80. A screw 86 is inserted into the screw hole 84 of the clamp member 82 and is screwed to a screw receiving hole 66 disposed in the wall 60. The screw 86 is second example of the fastener 80. By fastening of the screw 86 to the screw hole positioned in the wall 60, the clamp member 82 biases the electrical connector assembly 1 toward the O-ring 70. The biasing force exerted by the clamp member 82 on the electrical connector assembly 1 fixes the electrical connector assembly 1 to the wall 60 with a force sufficient to permit the O-ring 70 to create a seal between the wall 60 and the electrical connector assembly 1. Since the upper face 7a of the metal plate 7 of the electrical connector assembly 1 has good surface roughness, and the electrical connector assembly 1 and metal plate 7 are in close contact with each other, an airtight seal is created between the wall 60 and the electrical connector assembly 1.

Figure 5:
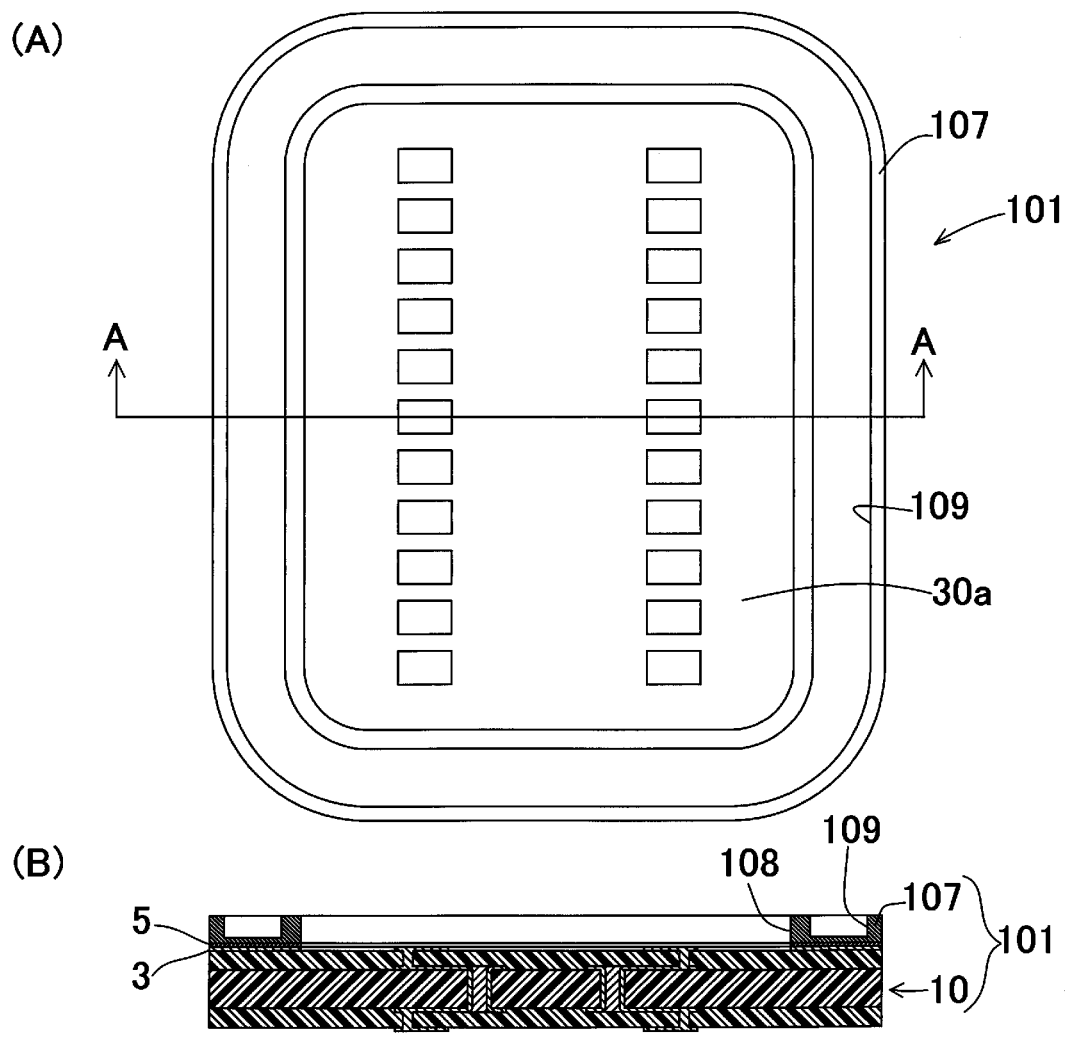
FIGS. 5A and 5B show an electrical connector assembly, FIG. 5A being a plan view thereof and FIG. 5B being a sectional view thereof taken along line A-A in FIG. 5A.

FIGS. 5A and 5B show a second embodiment of an electrical connector assembly. The electrical connector assembly 101 according to the second embodiment comprises a flat electrical connector 10 and a metal member 107 positioned on a surface of the electrical connector 10. The electrical connector 10 in the second embodiment is the same as the electrical connector 10 in the first embodiment.

Figure 6:
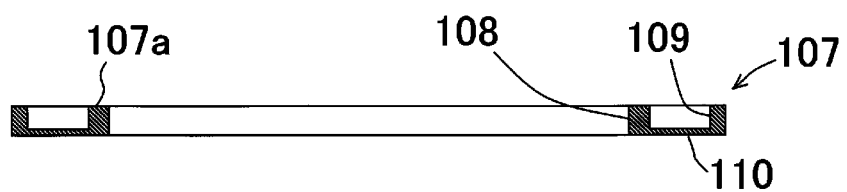
FIG. 6 is a side sectional view showing a metal member in the electrical connector assembly shown in FIGS. 5A and 5B.

In FIGS. 5A, 5B, and 6, the metal member 107 has a plate thickness thicker than that of the metal plate 7 of the first embodiment. A large opening 108 is disposed in a center of the metal member 107. The metal member 107 has approximately the same shape as that of the peripheral layer 3 of the electrical connector 10 on which plating can be performed. A recessed groove 109 into which an O-ring 70 (see FIG. 7) is disposed, is formed in the metal member 107 along an entire circumference of the opening 108. The metal member 107 has an approximately C-shaped sectional configuration opened upward by formation of the recessed groove 109. A flat surface 110 of the metal member 107, positioned on a side opposite to the recessed groove 109, contacts the electrical connector 10.

In an embodiment, an inner surface positioned at a base of the recessed groove 109 has surface roughness of at least Ra3.2 μm or less. In another embodiment, the inner surface has a surface roughness of at least Ra1.6 μm or less. In another embodiment, the inner surface has a surface roughness of Ra0.8 μm or less. The term "surface roughness region" means the metal member 107 has a surface roughness of any one of these Ra. Reference made herein to good surface roughness refers to a surface roughness of any one of these Ra.

In FIGS. 5A and 5B, the electrical connector assembly 101 the metal member 107 is positioned on a surface of the electrical connector 10. In an embodiment, the metal member 107 is soldered to the electrical connector 10. In another embodiment, an adhesive may be used similar to the adhesive in the first embodiment to attach the metal member 107 to the electrical connector 10.

Figure 7:
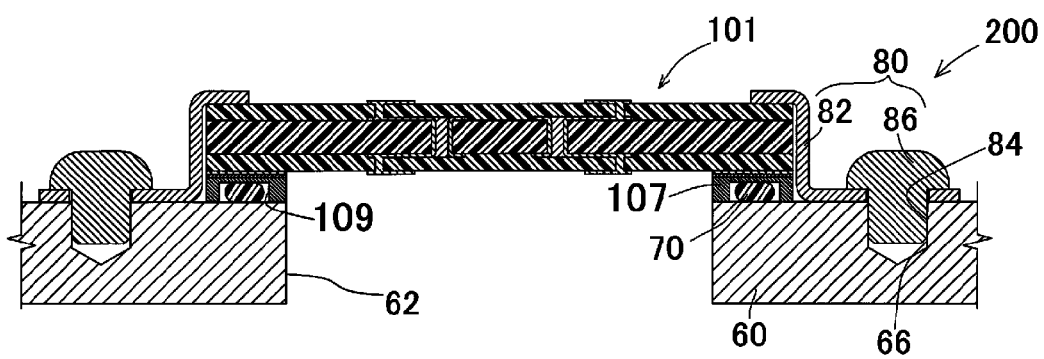
FIG. 7 is a sectional view of a mounting structure using the electrical connector assembly shown in FIGS. 5A and 5B.

In FIG. 7, the mounting structure 200 includes the electrical connector assembly 101, a wall 60 onto which the electrical connector assembly 101 is mounted, an O-ring 70 disposed between the electrical connector assembly 101 and the wall 60 in the recessed groove 109, and a fastener 80 for fixing the electrical connector assembly 101 to the wall 60. In this embodiment, since the recessed groove 109 receiving the O-ring 70 is provided in the metal member 107 of the electrical connector assembly 101, the circumferential groove in the wall 60 in the first embodiment is not used. However, the portion of the wall 60 with which the O-ring 70 contacts must have good surface roughness.

Next, a mounting procedure of the electrical connector assembly 101 to the wall 60 will be described. In FIG. 7, the O-ring 70 is first positioned around the entire opening 62 of the wall 60. Next, the electrical connector assembly 101 is positioned over the opening 62 of the wall 60, such that the O-ring 70 is positioned in the recessed groove 109 in the metal member 107. A clamp member 82 having a screw hole 84 is attached to the electrical connector assembly 101. The clamp member 82 is an exemplary fastener 80. A screw 86 is inserted into the screw hole 84 of the clamp member 82 to be screwed to a screw receiving hole 66 disposed in the wall 60 and it is fastened to the wall 60. The screw 86 is second example of the fastener 80

By fastening of the screw 86 to the screw receiving hole positioned in the wall 60, the clamp member 82 biases the electrical connector assembly 101 toward the O-ring 70. The biasing force exerted by the clamp member 82 on the electrical connector assembly 101 fixes the electrical connector assembly 101 to the wall 60 with a force sufficient to permit the O-ring 70 to create a seal between the wall 60 and the electrical connector assembly 10. Since an inner surface of the recessed groove 109 has good surface roughness and the electrical connector 10 and the metal member 107 are in close contact with each other, an airtight seal is created between the wall 60 and the electrical connector assembly 101.

Figure 8:
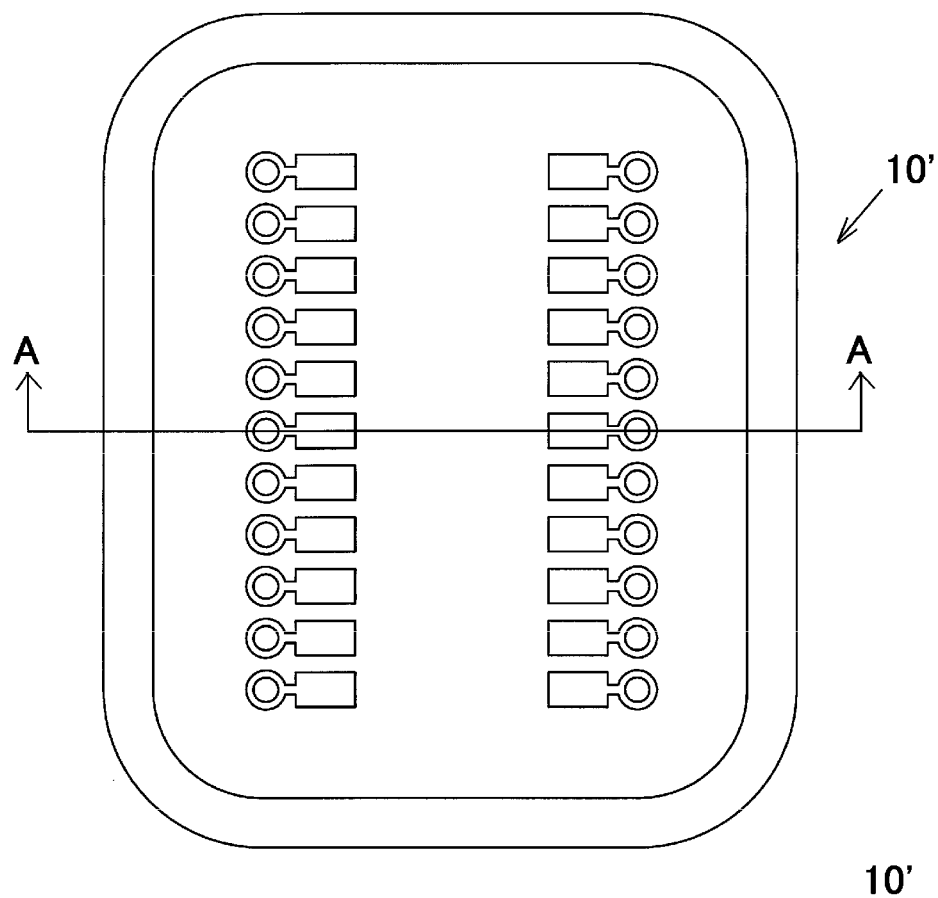
FIGS. 8A and 8B show an electrical connector, FIG. 8A being a plan view thereof and FIG. 8B being a sectional view thereof taken along line A-A in FIG. 8A.
Figure 8:
Figure 9:
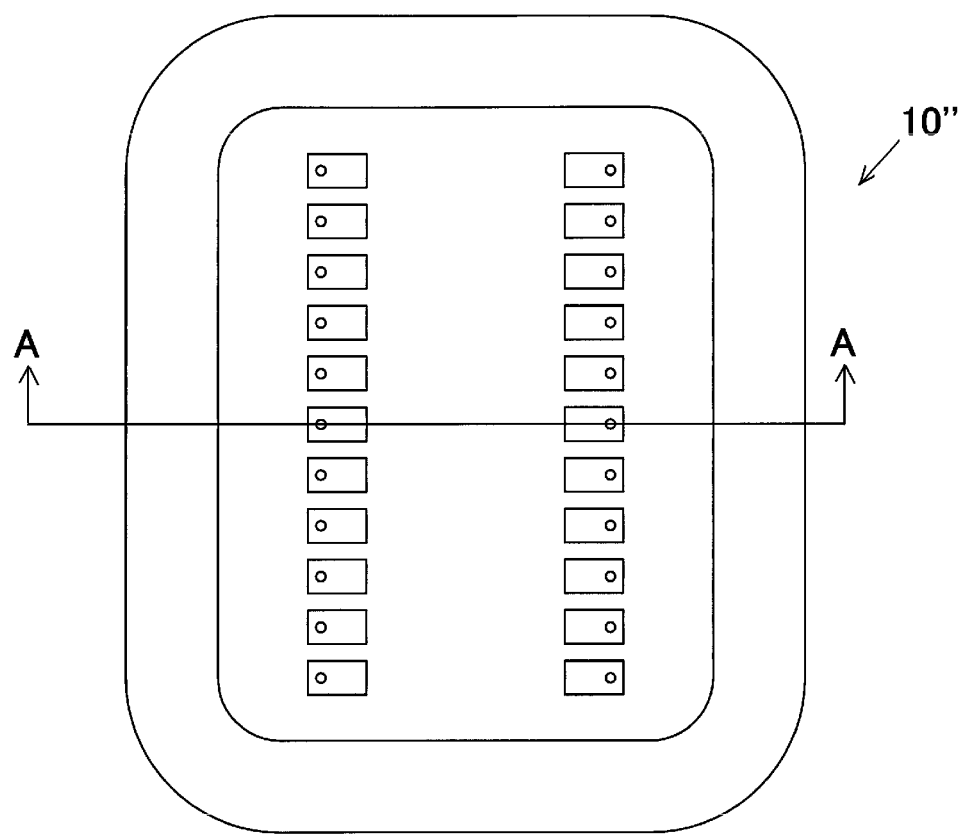
FIGS. 9A and 9B show an electrical connector, FIG. 9A being a plan view thereof and FIG. 9B being a sectional view thereof taken along line A-A in FIG. 9A.
Figure 9:
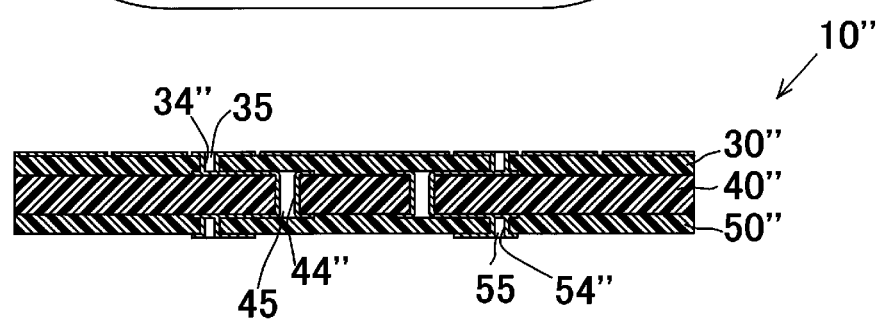

Although the electrical connector assemblies and the mounting structures using the same according to the embodiments of the present invention have been described above in detail, it is not intended to limit the present invention to these embodiments and various modifications can be adopted. For example, in the above-described embodiments of the present invention, the electrical connector is the four-layer board, but in other embodiments may be a double-side board 10', as shown in FIGS. 8A and 8B, instead of the four-layer board. Further, when the electrical connector is a multilayer board, it is not limited to the four-layer board and it may be a multilayer board having 6 or more layers. Further, when the electrical connector is constituted of a multilayer board, it is not required necessarily that all of the through-holes 34, 44, and 54 are filled with electrically-conductive plating or fillers. For example, as shown in FIGS. 9A and 9B, cavities 35, 45 and 55 may be formed in all or some of a multilayer board 10". Even when the cavities 35, 45 and 55 are formed, a first base member 30", a second base member 40" and a third base member 50" are brought into close contact with each other, and the cavities 35, 45 and 55 do not communicate with each other, so that air tightness can be held.

The sealing member may be other shapes such as an X-ring, instead of the O-ring 70. The fixture other than the clamp member and the screw may be used. The O-ring 70 may be disposed in the recessed groove 109 of the metal member 107 in advance, prior to attaching to the wall 60. That is, the O-ring 70 may be integral with the electrical connector assembly 101. The metal member 107 may be replaced by an insulating member such as a member made of resin. Moreover, an electrical component, such as another connector, may be mounted on the electrical connector. Furthermore, the metal plate 7 or the like constituting the surface roughness region may be provided not only on the top surface of the electrical connector assembly but also the bottom surface thereof.

What is claimed is:

1. An electrical connector assembly comprising:
an electrical connector positionable over an opening in a wall to form an airtight seal and an electrical connection between the inside and an outside of the wall, the electrical connector having an insulating board made of insulating material, the insulating board having a first surface facing the wall, a second surface on the side opposite to the first surface, and a side surface extending from a peripheral edge of the first surface to a peripheral edge of the second surface, and
an electrical connection portion made of electrically conductive material and extending from the first surface through the insulating board to the second surface to electrically connect the first surface to the second surface; and
a surface roughness region provided at the peripheral edge of the first surface.

2. The electrical connector assembly according to claim 1, further comprising a metal plate being larger than the opening and having the surface roughness region in contact with the peripheral edge of at least the first surface.

3. The electrical connector assembly according to claim 1, further comprising a flat resin member being larger than the opening and having the surface roughness region in contact with a the peripheral edge of at least the first surface.

4. The electrical connector assembly according to claim 1, further comprising a metal member being larger than the opening and attached to the insulating board, and having a recessed groove disposed along an entire periphery.

5. The electrical connector assembly according to claim 4, wherein the recessed groove has an inner surface having a surface roughness region.

6. The electrical connector assembly according to claim 4, wherein a sealing member is disposed in the recessed groove.

7. The electrical connector assembly according to claim 1, wherein the electrical connector comprises a multilayer board having four or more layers.

8. The electrical connector assembly according to claim 1, wherein the electrical connector comprises a double-sided board.

9. A mounting structure of an electrical connector assembly, comprising:
   a wall having an opening and a circumferential groove formed around the opening in one surface of the wall;
   an electrical connector assembly comprising:
      an electrical connector positioned over the opening and the circumferential groove to form an airtight seal and an electrical connection between the inside and an outside of the wall, and having an insulating board made of insulating material and having a first surface facing the wall,
      a second surface on the side opposite to the first surface, and a side surface extending from a peripheral edge of the first surface to a peripheral edge of the second surface, and
      an electrical connection portion made of electrically conductive material and extending from the first surface through the insulating board to the second surface to electrically connect the first surface to the second surface; and
      a surface roughness region provided at the peripheral edge of the first surface;
   a sealing member disposed in the circumferential groove between the wall and the electrical connector assembly and in contact with the surface roughness region; and
   a fixture connecting the electrical connector assembly to the wall.

10. The mounting structure of an electrical connector assembly according to claim 9, wherein the electrical connector assembly further comprises a metal plate being larger than the opening and having the surface roughness region in contact with the peripheral edge of at least the first surface.

11. The mounting structure of an electrical connector assembly according to claim 9, wherein the electrical connector assembly further comprises a flat resin member being larger than the opening and having the surface roughness region in contact with a the peripheral edge of at least the first surface.

12. The mounting structure of an electrical connector assembly according to claim 9, wherein the electrical connector comprises a multilayer board having four or more layers.

13. The mounting structure of an electrical connector assembly according to claim 9, wherein the electrical connector comprises a double-sided board.

14. A mounting structure of an electrical connector assembly, comprising:
   a wall having an opening;
   an electrical connector assembly comprising:
      an electrical connector positioned over the opening to form an airtight seal and an electrical connection between the inside and an outside of the wall, and having an insulating board made of insulating material and having a first surface facing the wall, a second surface on the side opposite to the first surface, and a side surface extending from a peripheral edge of the first surface to a peripheral edge of the second surface, and an electrical connection portion made of electrically conductive material and extending from the first surface through the insulating board to the second surface to electrically connect the first surface to the second surface;
   a flat member positioned on the first surface and having a recessed groove positioned completely around a peripheral edge of the flat member, and having an inner groove surface with a surface roughness region;
   a sealing member disposed in the recessed groove and in contact with the surface roughness region, and sandwiched between the recessed groove and a surface of the wall; and
   a fixture connecting the electrical connector assembly to the wall.

15. The electrical connector assembly according to claim 14, wherein the electrical connector comprises a multilayer board having four or more layers.

16. The electrical connector assembly according to claim 14, wherein the electrical connector comprises a double-sided board.

* * * * *